US011300589B2

United States Patent
Ueda

(10) Patent No.: US 11,300,589 B2
(45) Date of Patent: Apr. 12, 2022

(54) INSPECTION JIG

(71) Applicant: YOKOWO CO., LTD., Tokyo (JP)

(72) Inventor: Takashi Ueda, Tomioka (JP)

(73) Assignee: Yokowo Co., Ltd., Tokyo (JP)

( * ) Notice: Subject to any disclaimer, the term of this patent is extended or adjusted under 35 U.S.C. 154(b) by 144 days.

(21) Appl. No.: 16/616,511

(22) PCT Filed: Jul. 2, 2018

(86) PCT No.: PCT/JP2018/025083
§ 371 (c)(1),
(2) Date: Nov. 25, 2019

(87) PCT Pub. No.: WO2019/021749
PCT Pub. Date: Jan. 31, 2019

(65) Prior Publication Data
US 2020/0174039 A1    Jun. 4, 2020

(30) Foreign Application Priority Data

Jul. 24, 2017  (JP) .............................. JP2017-142800

(51) Int. Cl.
*G01R 1/073* (2006.01)
*G01R 31/28* (2006.01)

(52) U.S. Cl.
CPC ..... *G01R 1/07342* (2013.01); *G01R 31/2886* (2013.01)

(58) Field of Classification Search
CPC .......................... G01R 1/0491; G01R 1/0466; G01R 31/2886; G01R 1/07342; G01R 1/073
See application file for complete search history.

(56) References Cited

U.S. PATENT DOCUMENTS

| 4,906,920 A * | 3/1990 | Huff ..................... G01R 1/0735 324/73.1 |
| 2016/0187378 A1* | 6/2016 | Nagata ................. G01R 1/0416 324/756.05 |

FOREIGN PATENT DOCUMENTS

| JP | H02-163664 A | 6/1990 |
| JP | 2016-125876 A | 7/2016 |

OTHER PUBLICATIONS

International Search Report (with partial translation) and Written Opinion dated Sep. 25, 2018, issued in corresponding International Patent Application No. PCT/JP2018/025083.

\* cited by examiner

*Primary Examiner* — Lee E Rodak
*Assistant Examiner* — Brent J Andrews
(74) *Attorney, Agent, or Firm* — Morgan, Lewis & Bockius LLP

(57) ABSTRACT

An inspection jig includes a flexible substrate, a block, a pressing member, and a first pin fixed to the pressing member. The block has a first positioning hole opened in a substantially center portion of an opposite surface of a main surface thereof. The first pin is inserted into the first positioning hole. A large diameter portion and a small diameter portion are provided in an inner peripheral side of the first positioning hole. A diameter of the large diameter portion is smaller than a diameter of the large diameter portion. The large diameter portion is formed so as not to contact the first pin when the block is not inclined. The block is configured to be inclined with the first pin as a fulcrum.

15 Claims, 16 Drawing Sheets

INSPECTION JIG

TECHNICAL FIELD

The present invention relates to an inspection jig for inspecting electrical characteristics of an inspection object such as a semiconductor integrated circuit provided on a wafer.

BACKGROUND ART

In general, an inspection jig such as a probe card used for inspection of electrical characteristics of a semiconductor integrated circuit includes a main substrate and a flexible substrate joined to the main substrate by soldering or the like. A contact portion to be in contact with an electrode of the inspection object (for example, a wafer) is formed on the flexible substrate. The flexible substrate is pressed from a back side of the contact portion to an inspection object side through a block urged by a spring, and a contact force with the inspection object is applied to the flexible substrate. A probe card having such a configuration may be called a membrane type.

FIG. 15 shows a structure of main parts of an inspection jig of this type in the conventional art. A contact portion 41 to be in contact with an inspection object, for example, an electrode of a wafer W, is formed on the flexible substrate 40. The flexible substrate 40 is fixed to one surface of a main substrate 10 so that the contact portion 41 is exposed. Further, a unit pressing member 90 is fixed to the main substrate 10 in an arrangement behind the flexible substrate 40. A block 70A located behind (a back side of the contact portion 41) the flexible substrate 40 is supported by two or more pins 120 standingly fixed to the unit pressing member 90 so as to be movable in an axial direction of the pins 120. The flexible substrate 40 is pressed toward the inspection object side through the block 70A urged by a spring (not shown), and a contact force with the wafer W is applied to the flexible substrate 40. A movement amount of the block 70A toward a lower side (in a direction approaching the wafer W) is regulated by a retainer 20 fixed to the main substrate 10.

In this structure, positioning of the block 70A is performed by the two or more pins 120, so that positioning accuracy can be ensured. However, the block 70A cannot move except in the axial direction of the pin 120. For this reason, the inclination of the inspection jig relative to the inspection object is not absorbed.

An inspection jigs for RF (high frequency) devices in the conventional art performs inspection on one or two devices (IC, LSI or the like) on a wafer. Recently, an inspection jig capable of inspecting a large number (three or more) of devices simultaneously has begun to be required.

In order to simultaneously and stably contact a contact portion (with a larger area than before) of the flexible substrate 40 to a large number of devices on the wafer, it is necessary to maintain the accuracy of each member of the inspection jig and the mounting accuracy of the wafer and the inspection jig with high accuracy. In practice, due to the influence of the accuracy, the inspection jig may be slightly inclined with respect to the wafer during inspection. When the contact portion of the flexible substrate 40 is brought into contact with the electrode of the wafer in this state, the contact pressure is biased among a plurality of inspection locations, and a location where the contact pressure is weak is generated. Therefore, a method of increasing the overall contact pressure is taken to compensate for the location where the contact pressure is weak, but on this occasion, there is a disadvantage that the contact pressure may be excessive at some portion and solder balls on the wafer may be crushed.

CITATION LIST

Patent Literature

Patent Literature 1: JP-A-2016-125876

SUMMARY OF INVENTION

Technical Problem

In the inspection jig in the conventional art, there is no structural consideration for simultaneously and stably contacting a large-area contact portion of the flexible substrate 40 with a large number of devices on the wafer. For this reason, the inspection jig in the conventional art has a problem that the contact pressure may be weak or excessive at a certain location.

The present invention has been made in recognition of such a situation. An object of the present invention is to provide an inspection jig in which a contact portion of a flexible substrate can be inclined, so that an inclination of the contact portion with respect to an inspection object can be absorbed, and a uniform contact state can be obtained.

Solution to Problem

An aspect of the present invention provides an inspection jig. The inspection jig includes a flexible substrate having a contact portion configured to be contact with an inspection object, a block disposed on an opposite side of the contact portion of the flexible substrate and configured to urge the contact portion toward the inspection object, and a pressing member disposed on an opposite side of a main surface of the block in contact with the flexible substrate. The block has a first positioning hole that is opened in a substantially center portion of an opposite surface of the main surface, and into which a first pin fixed to the pressing member is inserted. A large diameter portion that is not in contact with the first pin when the block is not inclined and a small diameter portion are provided on an inner peripheral side of the first positioning hole. A diameter of the small diameter portion is smaller than a diameter of the large diameter portion. The block is configured to be inclined with the first pin as a fulcrum.

The block may include a block main body having a main surface which is in contact with the flexible substrate, and a bush which is fixed to a substantially center portion of the block main body on an opposite surface of the main surface of the block main body. The bush may be formed with the first positioning hole into which the first pin is inserted.

A second positioning hole of the block may be provided at a position away from a center portion of the opposite surface of the main surface. A second pin fixed to the pressing member may be inserted into the second positioning hole.

The second positioning hole may be an elongated hole in which a width in a first direction connecting the first pin and the second pin is longer than a width in a second direction orthogonal to the first direction.

The flexible substrate may be fixed to a main substrate. The contact portion may protrude from a contact through hole of the main substrate. The pressing member may be fixed to the main substrate.

The large diameter portion may be located on a side of the pressing member with respect to the small diameter portion.

The contact portion of the flexible substrate may be positioned on an extension line of an axial direction of the first pin.

In addition, any combinations of the above constituent elements, and expressions of the invention that are converted in methods and systems are also effective as aspects of the present invention.

Advantageous Effects of Invention

According to the inspection jig of the present invention, the block behind the flexible substrate is supported in an inclinable manner. Therefore, the contact portion of the flexible substrate can also be inclined. Accordingly, the inspection jig can absorb an inclination of the contact portion with respect to the inspection object, and can obtain a uniform contact state.

DESCRIPTION OF EMBODIMENTS

Figure 1:
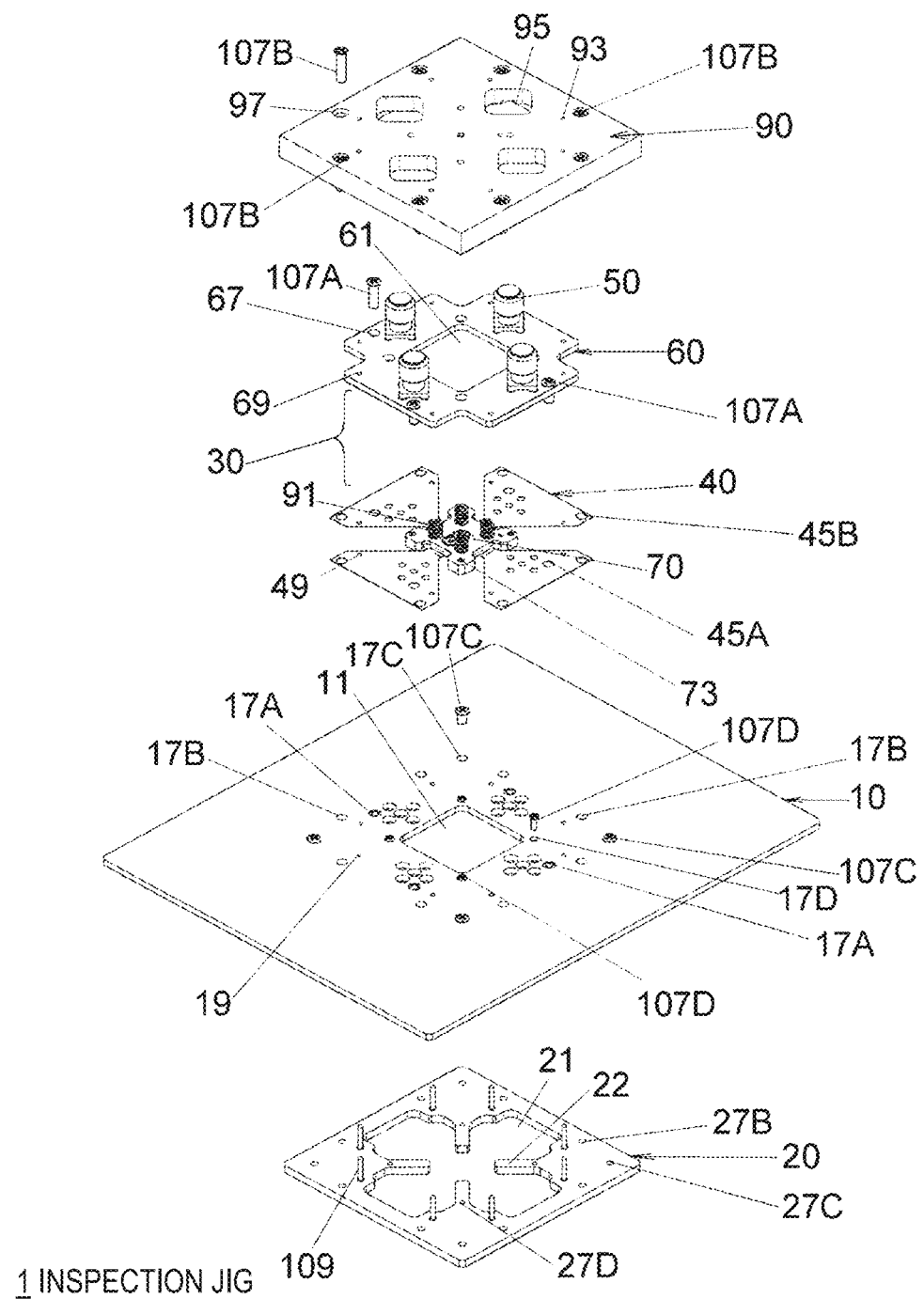
FIG. 1 is an exploded perspective view showing an inspection jig according to an embodiment of the present invention as viewed from above.

Hereinafter, a preferred embodiment of the present invention will be described in detail with reference to the drawings. In addition, the same or equivalent components, members, processing or the like illustrated in the drawings are denoted by the same reference numerals, and a repetitive description thereof will be omitted. Further, the embodiment is not intended to limit the invention and all the features and combinations thereof described in the embodiment are not necessarily essential to the present invention.

An inspection jig 1 according to an embodiment of the present invention will be described with reference to FIGS. 1 to 14. The inspection jig 1 is a so-called probe card, and includes a main substrate 10, a retainer 20, a contact unit 30, and a unit pressing member 90. An insulating glass epoxy substrate, for example, is adopted as the main substrate 10. The retainer 20 is made of a metal such as stainless steel, for example. The unit pressing member 90 is made of a resin molded body, for example.

The contact unit 30 is a replacement contact unit of the inspection jig 1. The contact unit 30 is fixed to the main substrate 10 of the inspection jig 1 in a replaceable manner. The contact unit 30 includes a flexible substrate 40, four coaxial connectors 50 such as SMA connectors, a sub substrate 60 made of a glass epoxy substrate, for example, and a block 70 made of a resin molded body, for example. The structure of the block 70 and the periphery thereof will be described later.

Figure 2:
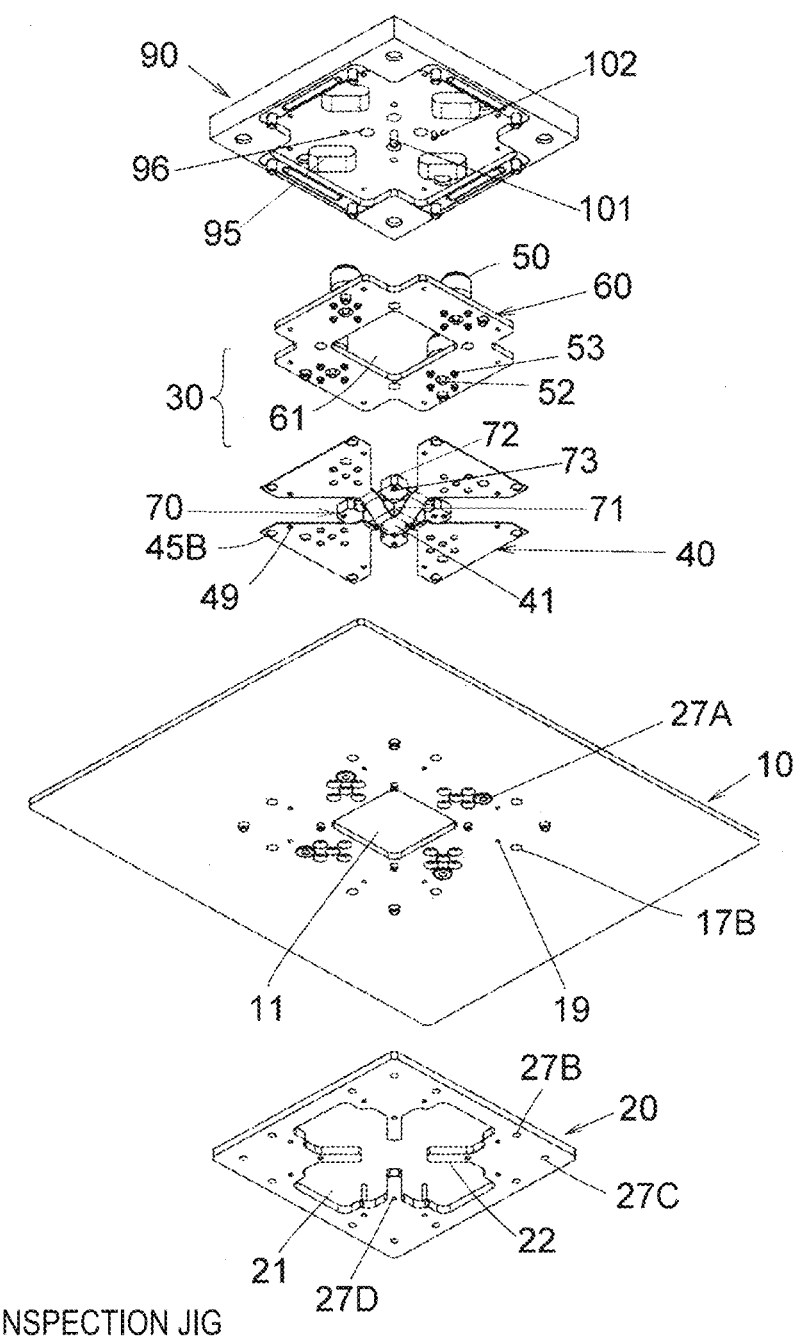
FIG. 2 is an exploded perspective view showing the inspection jig of FIG. 1 as viewed from below.
Figure 3:
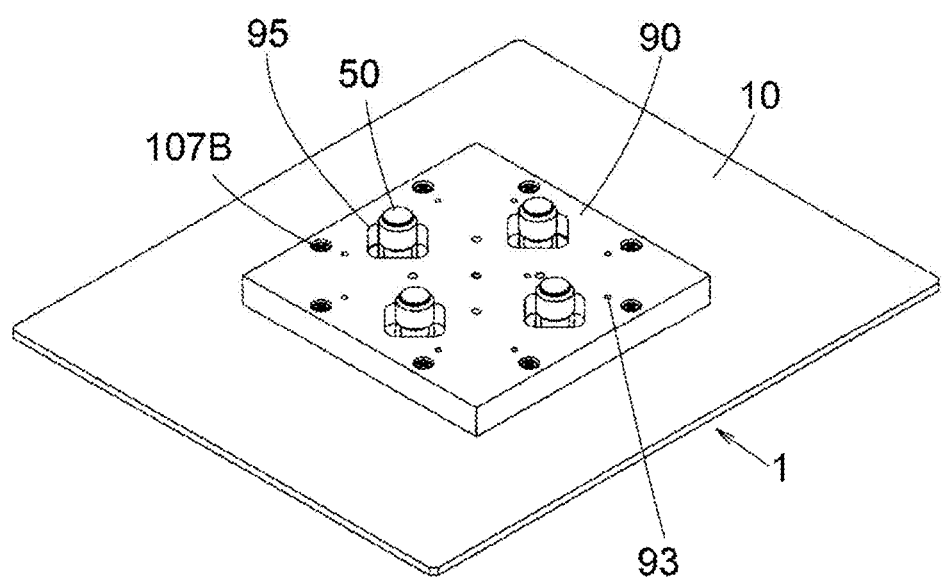
FIG. 3 is a perspective view showing the inspection jig of FIG. 1 as viewed from above.
Figure 4:
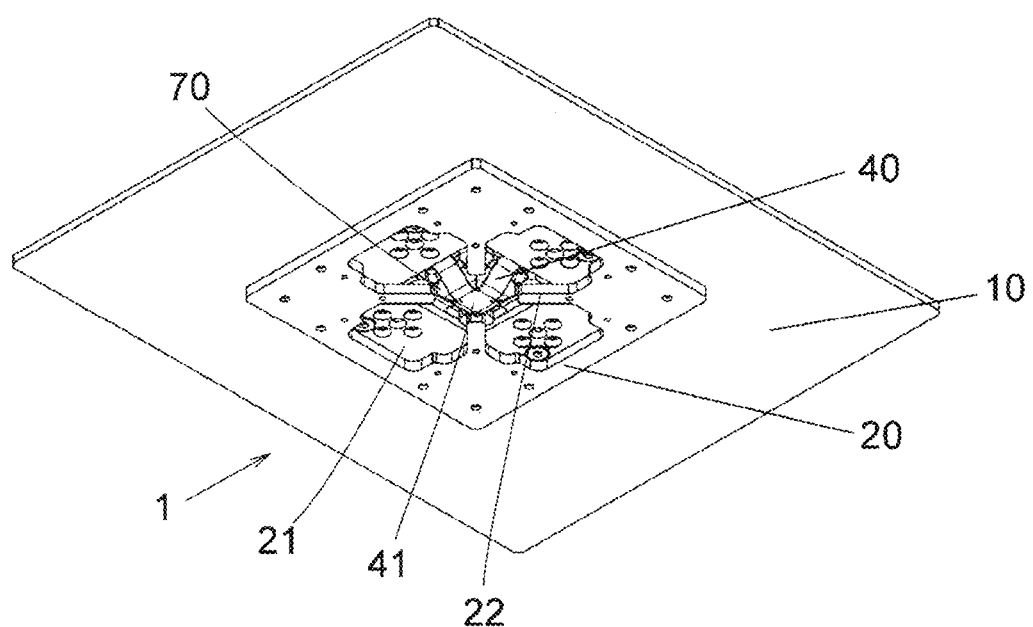
FIG. 4 is a perspective view showing the inspection jig of FIG. 1 as viewed from below.
Figure 5:
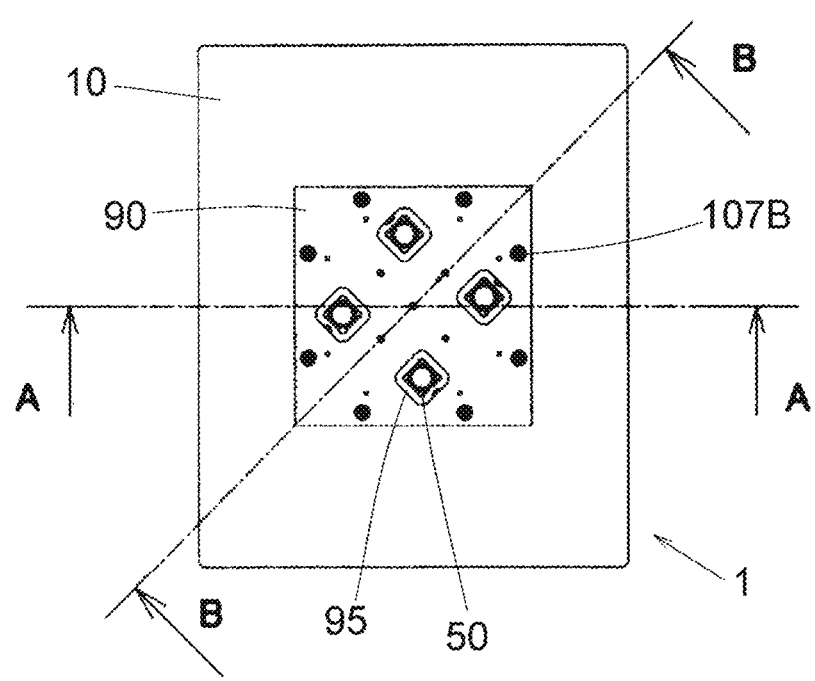
FIG. 5 is a plan view showing the inspection jig of FIG. 1.
Figure 6:
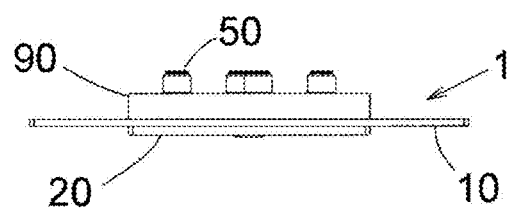
FIG. 6 is a front view showing the inspection jig of FIG. 1.
Figure 7:
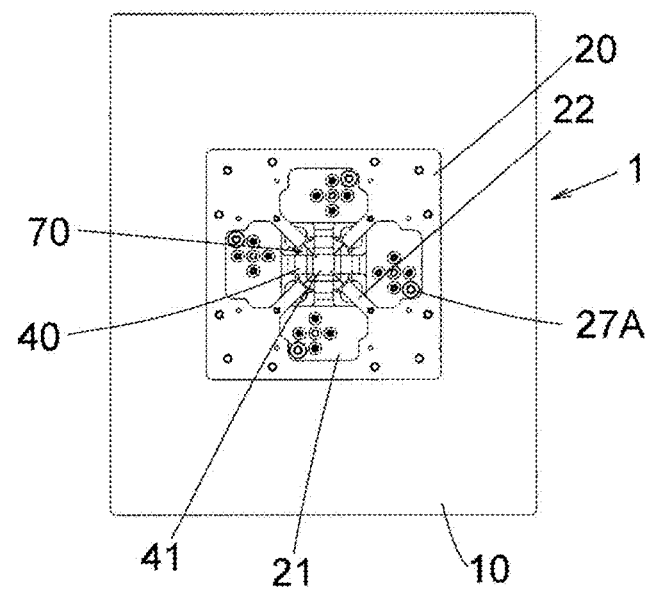
FIG. 7 is a bottom view showing the inspection jig of FIG. 1.

The flexible substrate 40 is provided for contact with an inspection object such as a wafer. The flexible substrate 40 is located on a side of one surface (lower surface) of the sub substrate 60. As shown in FIGS. 2 and 7, on a lower surface (a surface on the opposite side of the sub substrate 60) of the flexible substrate 40 that faces the inspection object, a contact portion 41 that can contact an electrode of the inspection object such as a wafer is provided. The contact portion 41 is an assembly of bump electrodes for signal and bump electrodes for DC which is located at the center portion of a cross portion of the flexible substrate 40. The bump for signal (not shown) is electrically connected to a leg for signal 52 of the coaxial connector 50 via a pattern for signal of the flexible substrate 40 by soldering or the like. A ground pattern of the flexible substrate 40 is electrically connected to a leg for ground 53 of the coaxial connector 50. The flexible substrate 40 is further provided with screwing through holes 45A and 45B and positioning through holes 49. The screwing through holes 45A are provided for allowing screws (fasteners) 107A that fix the contact unit 30 to the main substrate 10 to pass through. The screwing through holes 45B are provided for allowing screws (fasteners) 107B that fix the unit pressing member 90 to the main substrate 10 to pass through. The positioning through holes 49 are provided for allowing positioning pins 109 (standing on the retainer 20) that position the contact unit 30 with respect to the main substrate 10 to pass through.

The four coaxial connectors 50 are fixed to the sub substrate 60 as an electrically insulating hard substrate. The four coaxial connectors 50 are provided at positions that surround the contact portion 41 of the flexible substrate 40. A coaxial cable extending from an inspection device (tester) (not shown) can be detachably connected to the four coaxial connectors 50. The sub substrate 60 is provided for the purpose of preventing a large load from being applied to a joint portion (soldering portion) between the flexible substrate 40 and the coaxial connector 50 when the coaxial cable is attached to and detached from the coaxial connector 50. The sub substrate 60 is provided with a center through hole 61, screwing through holes 67, and positioning through holes 69. The center through hole 61 becomes a space for arranging the block 70. The screwing through holes 67 are provided for allowing the screws (fasteners) 107A that fix the contact unit 30 to the main substrate 10 to pass through. The positioning through holes 69 are provided for allowing the positioning pins 109 (standing on the retainer 20) that position the contact unit 30 with respect to the main substrate 10 to pass through.

The main substrate 10 is provided with a contact through hole 11 for allowing the contact portion of the flexible substrate 40 to protrude downward, screwing through holes 17A, 17B, 17C, and 17D, and positioning through holes 19. The screwing through holes 17A are provided for allowing the screws 107A that fix the contact unit 30 to the main substrate 10 to pass through. The screwing through holes 17B are provided for allowing the screws (fasteners) 107B that fix the unit pressing member 90 to the main substrate 10 to pass through. The screwing through holes 17C and 17D are respectively provided for allowing screws (fasteners) 107C and 107D that respectively fix the retainer 20 to the main substrate 10 to pass through. The positioning through holes 19 are provided for allowing the positioning pins 109 that position the contact unit 30 with respect to the main substrate 10 to pass through.

The retainer 20 is, for example, a metal plate, and serves to regulate a protruding amount of the contact unit 30 downward from the main substrate 10. The retainer 20 is provided with a contact through hole 21 and screw holes 27B, 27C, and 27D. The contact through hole 21 is provided for allowing the contact portion 41 of the flexible substrate 40 to protrude downward. Block base portions 22 are formed by portions of the contact through hole 21 extending inward. Two pairs of block base portions 22 are provided so as to be orthogonal to each other. The retainer 20 is attached (fixed) to a lower surface of the main substrate 10 by the screws (fasteners) 107C and 107D passing through the screwing through holes 17C and 17D of the main substrate 10 and screwed into the screw holes 27C and 27D. As shown in FIGS. 2 and 7, nuts 27A are fixed to the lower surface of the main substrate 10 by soldering. The contact unit 30 is fixed to the main substrate 10 with screws 107A. The screws 107A pass through the screwing through holes 17A of the main substrate 10 and are screwed into the nuts 27A. The unit pressing member 90 is fixed to the main substrate 10 with screws 107B. The screws 107B pass through the screwing through holes 97 formed in the unit pressing member 90 and the through holes 45B of the flexible substrate 40, penetrate the screwing through holes 17B of the main substrate 10, and are screwed into the screw holes 27B of the retainer 20.

The positioning pins 109 stand on the retainer 20 and are fixed to the retainer 20. The positioning pins 109 protrude upward from an upper surface of the main substrate 10. The positioning pins 109 serve to position the main substrate 10, the contact unit 30, and the unit pressing member 90 relative to each other.

Figure 10:
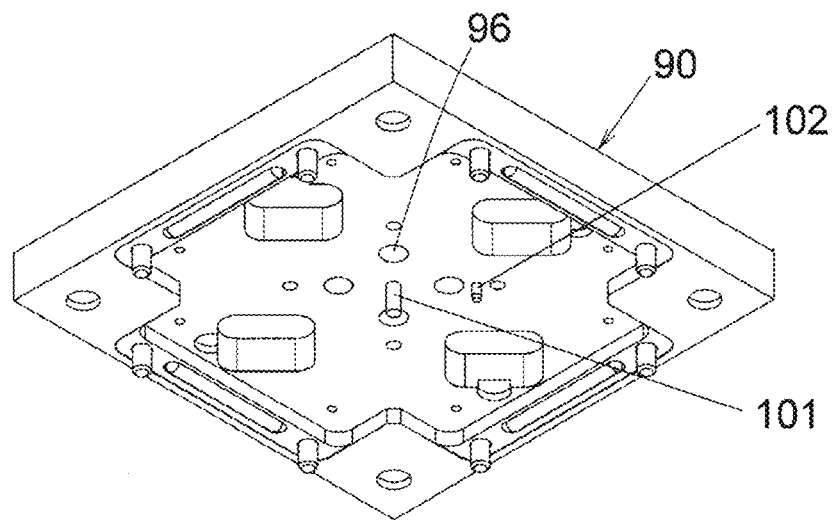
FIG. 10 is a perspective view showing a pressing member according to the embodiment as viewed from below.
Figure 11:
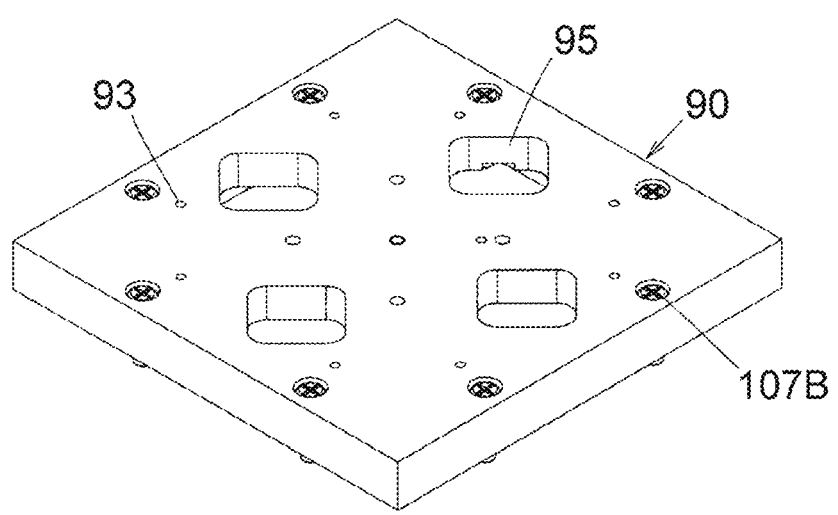
FIG. 11 is a perspective view showing the pressing member of FIG. 10 as viewed from above.

The unit pressing member 90 is a member that presses the contact unit 30 from above. As shown in FIGS. 10 and 11, the unit pressing member 90 is provided with positioning through holes 93, connector through holes 95, and spring recesses 96. The positioning through holes 93 are provided for allowing the positioning pins 109 to be inserted through. The positioning pins 109 position the unit pressing member 90 with respect to the main substrate 10 and the contact unit 30. The connector through holes 95 are provided for allowing the coaxial connectors 50 to protrude upward. The spring recesses 96 are formed at four locations on the unit pressing member 90. One end of each of four springs 91 enters each of the spring recesses 96. The spring recesses 96 support the four springs 91. The springs 91 as urging members urge the block 70 downward (that is, the contact portion 41 of the flexible substrate 40 is urged downward) in a state where the unit pressing member 90 is fixed to the main substrate 10 with the screws 107B. Therefore, a contact force with an inspection object such as a wafer is applied to the contact portion 41 of the flexible substrate 40. A first pin 101 and a second pin 102 stand on the unit pressing member 90 and are fixed to the unit pressing member 90 so as to position the block 70.

Figure 8:
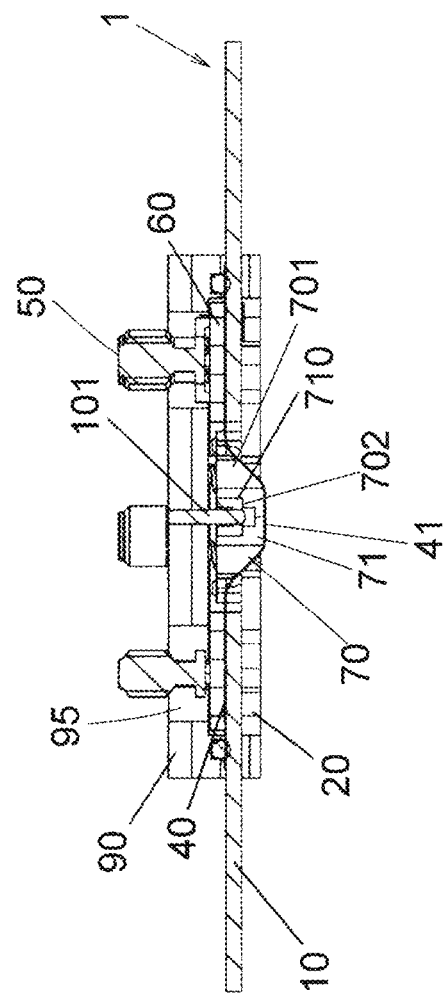
FIG. 8 is a sectional view taken along a line A-A in FIG. 5.
Figure 9:
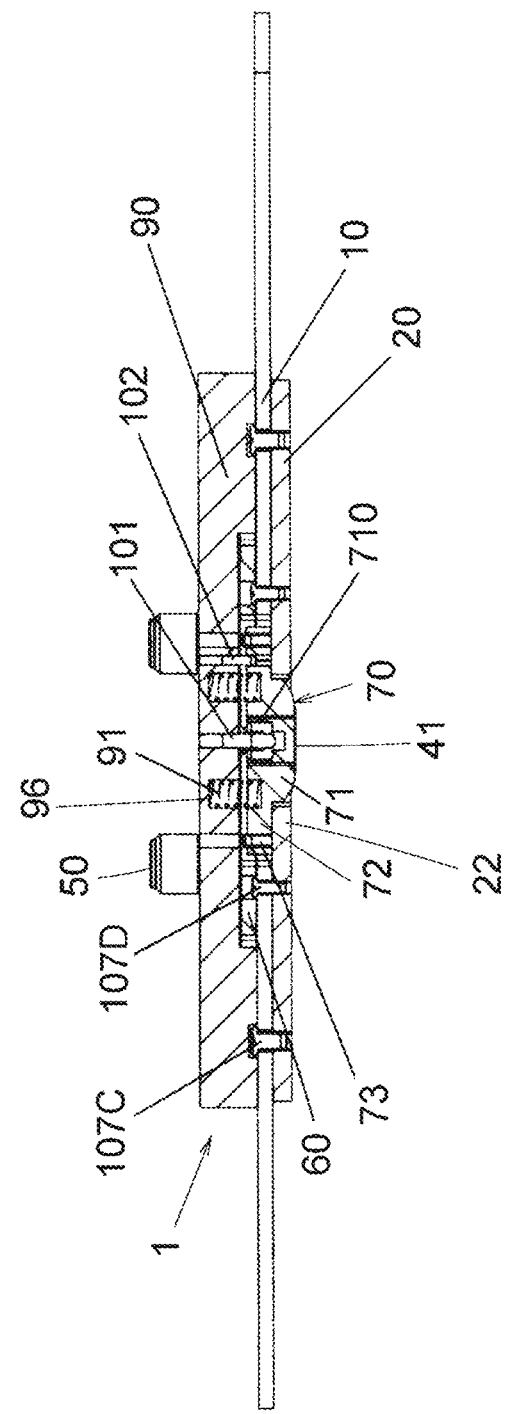
FIG. 9 is a sectional view taken along a line B-B in FIG. 5.

In a state where the contact unit 30 is fixed to the main substrate 10, the block 70 is urged downward by the springs 91, and holds the flexible substrate 40 in a state where the contact portion 41 protrudes downward from the main substrate 10. As shown in FIGS. 8 and 9 and the like, the block 70 includes four legs 72 around a pyramid portion 71 which is at the center of the block 70 and protrudes downward. A parallelism adjusting screw 73 is attached to each leg 72 of the block 70. A tip of the parallelism adjusting screw 73 comes into contact (abut) with the block base portion 22 of the retainer 20, and the height and inclination of the block 70 with respect to the retainer 20 can be adjusted.

Figure 12:
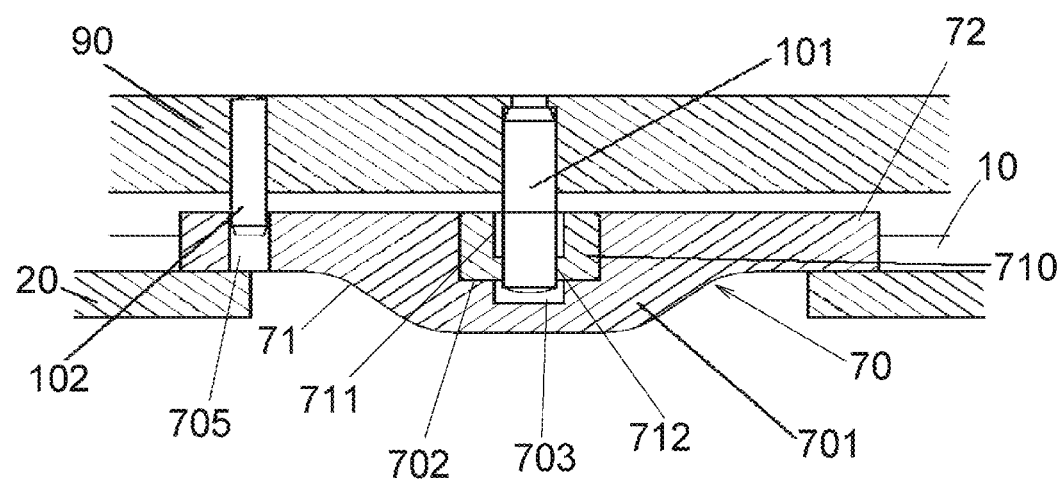
FIG. 12 is an enlarged sectional view showing a block and main parts at the periphery thereof according to the embodiment, when not in contact with a wafer which is an inspection object.
Figure 13:
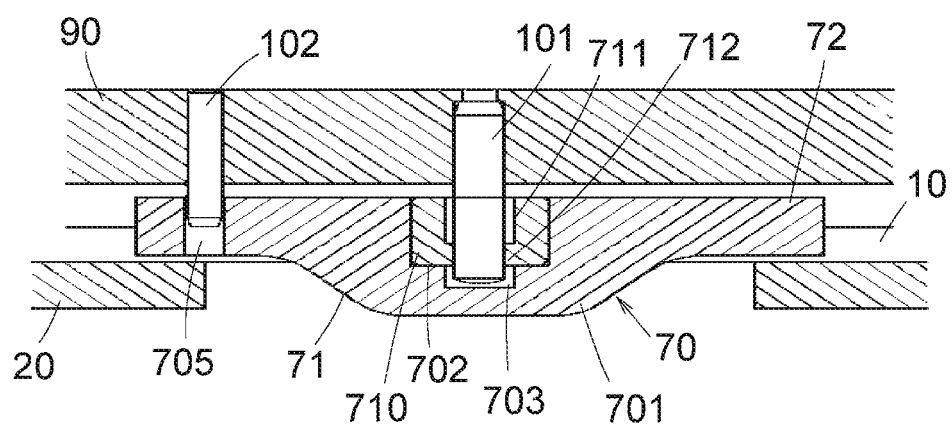
FIG. 13 is an enlarged sectional view showing the block and the main parts at the periphery thereof according to the embodiment, when in contact with the wafer which is an inspection object but when the block is not inclined.
Figure 14:
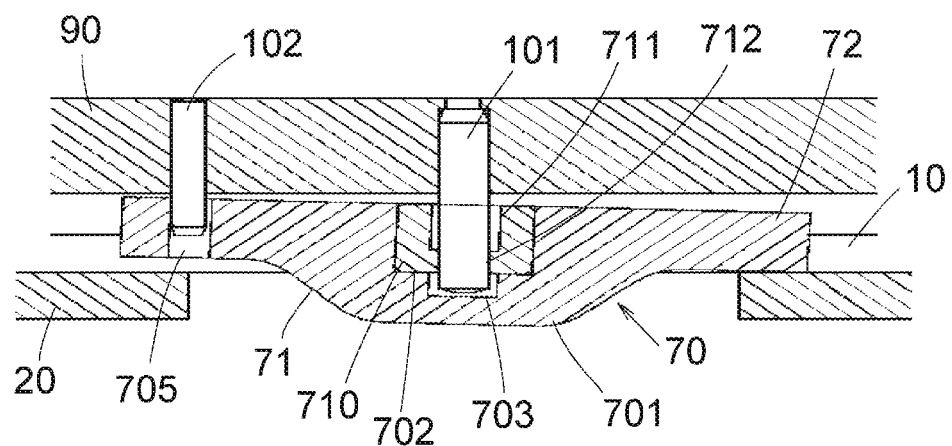
FIG. 14 is an enlarged sectional view showing the block and the main parts at the periphery thereof according to the embodiment, when in contact with the wafer which is an inspection object and when the block is inclined.
Figure 15:
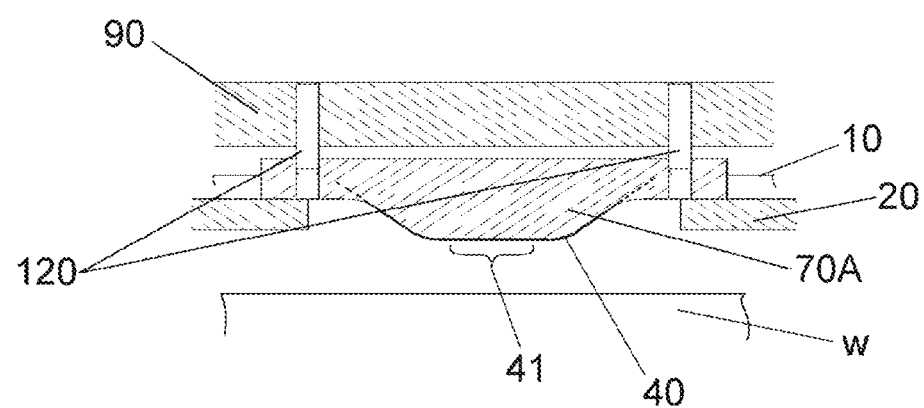
FIG. 15 is an enlarged sectional view of main parts showing the configuration of the main parts of an inspection jig in the conventional art.
Figure 16:
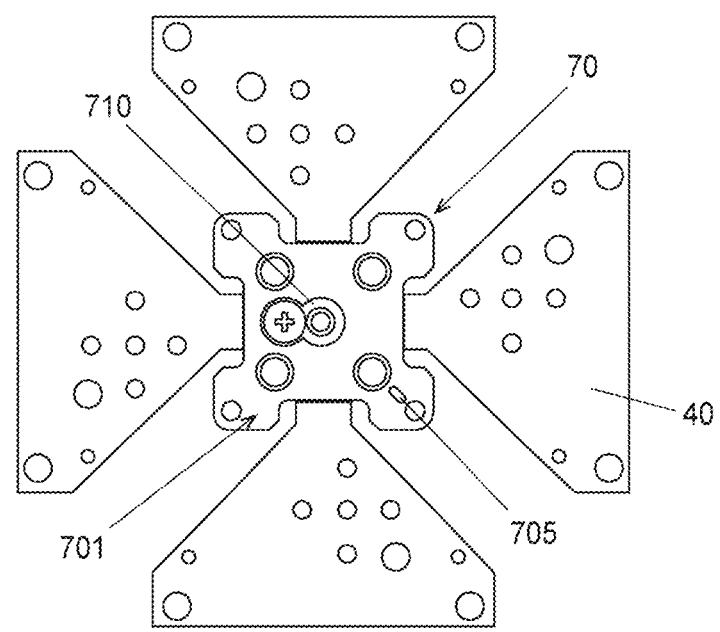
FIG. 16 is a top view showing the block and main parts at the periphery thereof according to the embodiment.

The point that the block 70 can be inclined will be described in detail with reference to FIGS. 8, 9, and 12 to 14. In FIGS. 12 to 14, the flexible substrate 40 is not shown for easy understanding on the posture of the block 70. The block 70 includes a block main body 701 (including the pyramid portion 71 and four legs 72) and a cylindrical bush 710. The block main body 701 has a main surface, and the main surface of the block main body 701 is in contact with an opposite surface of the contact portion 41 of the flexible substrate 40. A bushing arrangement hole 702 that is a non-through hole is formed at a substantially center portion of an opposite surface of the main surface of the block main body 701. The bush 710 is pressed and fixed in the bushing arrangement hole 702. The bush 710 and the block main body 701 are resin parts. In addition, the bush 710 may be a metal part, and the bush arrangement hole 702 may be a through hole.

As shown in FIGS. 12 to 14 and 16, a large diameter portion 711 and a small diameter portion 712 are provided on the inner periphery of the bush 710. The large diameter portion 711 and the small diameter portion 712 form a first positioning hole. The first pin 101 is inserted (fitted) to the inner periphery of the small diameter portion 712. Therefore, the contact portion 41 of the flexible substrate 40 is positioned on an extension line of the axial direction of the first pin 101. The large diameter portion 711 does not contact the first pin 101 when the block 70 is not inclined (the state shown in FIGS. 12 and 13). The small diameter portion 712 has a smaller inner diameter than an inner diameter of the large diameter portion 711. A recess 703 is formed at the bottom of the bushing arrangement hole 702 so that the first pin 101 does not contact the bottom. The length of the small diameter portion 712 in the axial direction is shorter than the length of the entire bush 710 in the axial direction. Therefore, even if the gap between the inner periphery of the small diameter portion 712 and the first pin 101 is very small, the block 70 can be inclined with the first pin 101 as a fulcrum. The second pin 102 is inserted (fitted) into a second positioning hole 705 in the periphery of the block main body 701. The second pin 102 positions the block main body 701 in a rotation direction. Here, the second positioning hole 705 is an elongated hole which is long in a linear direction connecting the first pin 101 and the second pin 102. That is, the width of the second positioning hole 705 in a first direction connecting the first pin 101 and the second pin 102 is larger than the width of the second positioning hole 705 in a second direction orthogonal to the first direction. As a result, the change in the posture of the block 70 in an inclination direction can be allowed without degrading the positioning accuracy of the block 70 in the rotation direction.

Next, the operation of the main parts of the present embodiment will be described with reference to FIGS. 8, 9, and 12 to 14. If the contact portion 41 is not parallel to the main substrate 10 (a surface to be inspected of an inspection object such as IC and LSI on the wafer), the parallelism adjusting screw 73 adjusts the block 70 so that the block 70 is as parallel as possible to the surface to be inspected of the inspection object such as IC or LSI on the wafer. FIGS. 8, 9 and 12 show a state before inspection in which the contact portion 41 of the flexible substrate 40 is not in contact with the inspection object.

From this state, the inspection jig 1 is moved (lowered) by a mechanism (not shown), the plurality of bump electrodes of the contact portion 41 of the flexible substrate 40 are brought into contact with electrodes of the inspection object with a necessary contact pressure, and the inspection of the electrical characteristics is performed. FIG. 13 shows a state where the parallelism between the surface to be inspected of the inspection object and the contact portion 41 of the flexible substrate 40 on the main surface side of the block 70 is high. Here, the block 70 is not inclined and presses a back side of the contact portion 41 of the flexible substrate 40.

Even in a state where the parallelism between the surface to be inspected and the contact portion 41 of the flexible substrate 40 is low, as shown in FIG. 14, the block 70 is inclined such that the contact portion 41 of the flexible substrate 40 is parallel to the surface to be inspected of the inspection object, and therefore, the plurality of bump electrodes of the contact portion 41 can be brought into contact with the electrodes of the inspection object with a uniform contact pressure.

According to the present embodiment, the following effects can be achieved.

(1) According to the embodiment, the center portion of the block 70 is fitted to the first pin 101 fixed to the unit pressing member 90 such that a required gap exists therebetween, and the block 70 is inclinable with the first pin 101 as a fulcrum. Therefore, in the inspection jig according to the embodiment, the inclination of the contact portion 41 of the flexible substrate 40 with respect to the inspection object such as a wafer can be absorbed, and a uniform contact state can be obtained with respect to a large number of bump electrodes of the contact portion 41. Accordingly, the contact portion 41 can have a larger area than that in the conventional art, and a large number of devices on the wafer can be inspected simultaneously.

(2) The second pin 102 is inserted into the second positioning hole 705 in the periphery of the block 70, so that the movement of block in the rotation direction can be restricted while ensuring the freedom of movement in the inclination direction. At that time, the second positioning hole 705 is an elongated hole having a long width in the linear direction connecting the first pin 101 and the second pin 102, so that the changing range in the posture of the block 70 in the inclination direction can be sufficiently increased without degrading the positioning accuracy of the block 70 in the rotation direction.

(3) The block 70 includes the block main body 701, and the bush 710 which is pressed and fixed thereto. The block 70 and the first pin 101 come into contact on the inner periphery of the bush 710. Therefore, even if the block 70 slides in the axial direction of the first pin 101, an area in contact with the first pin 101 is constant, and the amount of inclination that can be absorbed is always constant.

(4) The large diameter portion 711 that is not in contact with the first pin 101 when the block 70 is not inclined and the small diameter portion 712 which has a diameter smaller than a diameter of the large diameter portion 711 are provided on the inner periphery of the hush 710. The first pin 101 is inserted into the inner periphery of the small diameter portion 712. Therefore, even if the gap between the first pin 101 and the inner periphery of the small diameter portion 712 having a short length in the axial direction is very small, the block 70 can be inclined with the first pin 101 as a fulcrum.

Although the present invention has been described above by taking the embodiment as an example, it will be understood by those skilled in the art that various modifications can be made to each component and each processing process of the embodiment. Hereinafter, a modification will be described.

In the above embodiment, the block has a combined structure of the block main body and the bush, but the block may be a single resin part as long as the shape of the hole into which the first pin is inserted can be similarly formed.

It is apparent that the shape of each member configuring the inspection jig can be appropriately changed in accordance with the inspection object.

REFERENCE SIGNS LIST 1 inspection jig
10 main substrate
11 contact through hole
20 retainer
30 contact unit
40 flexible substrate
41 contact portion
50 coaxial connector
60 sub substrate
70 block
71 pyramid portion
72 leg
73 parallelism adjusting screw
90 unit pressing member
91 spring (urging unit)
101 first pin
102 second pin
701 block main body
702 bushing arrangement hole
710 cylindrical bush
711 large diameter portion
712 small diameter portion

The invention claimed is:
1. An inspection jig, comprising:
a flexible substrate having a contact portion configured to be brought into contact with an inspection object;
a block disposed on an opposite side of the contact portion of the flexible substrate, the block having a main surface in contact with the flexible substrate and being configured to urge the contact portion toward the inspection object;
a pressing member disposed on an opposite side of the main surface of the block; and
a first pin fixed to the pressing member, wherein: the block has a first positioning hole being a through hole opened in a substantially center portion of an opposite surface of the main surface, the first pin is inserted into the first positioning hole,
a large diameter portion and a small diameter portion are provided in an inner peripheral side of the first positioning hole,
a diameter of the small diameter portion is smaller than a diameter of the large diameter portion, the large diameter portion is formed so as not to contact the first pin when the block is not inclined,
the block is configured to be inclined with the first pin as a fulcrum,
the block has a second positioning hole opened at a position away from a center portion of the opposite surface, a second pin is fixed to the pressing member, the second pin is inserted into the second positioning hole, and
the second positioning hole is an elongated hole in which a width in a first direction connecting the first pin and the second pin is longer than a width in a second direction orthogonal to the first direction.

2. The inspection jig according to claim 1, wherein the block includes:
a block main body having the main surface; and
a bush fixed to the substantially center portion of the opposite surface, the first positioning hole being formed in the bush.

3. The inspection jig according to claim 1, wherein:
the flexible substrate is fixed to a main substrate,
the contact portion protrudes from a contact through hole of the main substrate, and
the pressing member is fixed to the main substrate.

4. The inspection jig according to claim 1, wherein the large diameter portion is located on a side of the pressing member with respect to the small diameter portion.

5. The inspection jig according to claim 1, wherein the contact portion of the flexible substrate is located on an extension line of an axial direction of the first pin.

6. An inspection jig, comprising:
a flexible substrate having a contact portion configured to be brought into contact with an inspection object;
a block disposed on an opposite side of the contact portion of the flexible substrate, the block having a main surface in contact with the flexible substrate, and being configured to urge the contact portion toward the inspection object;
a pressing member disposed on an opposite side of the main surface of the block; and
a first pin fixed to the pressing member, wherein:
the block has a first positioning hole opened in a substantially center portion of an opposite surface of the main surface,
the first pin is inserted into the first positioning hole,
a large diameter portion and a small diameter portion are provided in an inner peripheral side of the first positioning hole,
a diameter of the small diameter portion is smaller than a diameter of the large diameter portion,
the large diameter portion is formed so as not to contact the first pin when the block is not inclined,
the first pin is fitted into the small diameter portion,
the block is configured to be inclined with the first pin as a fulcrum,
the block has a second positioning hole opened at a position away from a center portion of the opposite surface,
a second pin is fixed to the pressing member,
the second pin is inserted into the second positioning hole, and
the second positioning hole is an elongated hole in which a width in a first direction connecting the first pin and the second pin is longer than a width in a second direction orthogonal to the first direction.

7. The inspection jig according to claim 6, wherein the block includes:
a block main body having the main surface; and
a bush fixed to the substantially center portion of the opposite surface, and the first positioning hole is being formed in the bush.

8. The inspection jig according to claim 6, wherein:
the flexible substrate is fixed to a main substrate,
the contact portion protrudes from a contact through hole of the main substrate, and
the pressing member is fixed to the main substrate.

9. The inspection jig according to claim 6, wherein the large diameter portion is located on a side of the pressing member with respect to the small diameter portion.

10. The inspection jig according to claim 6, wherein the contact portion of the flexible substrate is located on an extension line of an axial direction of the first pin.

11. An inspection jig, comprising:
a flexible substrate having a contact portion configured to be brought into contact with an inspection object;
a block disposed on an opposite side of the contact portion of the flexible substrate, the block having a main surface in contact with the flexible substrate and being configured to urge the contact portion toward the inspection object;
a pressing member disposed on an opposite side of the main surface of the block; and
a first pin fixed to the pressing member, wherein:
the block has a first positioning hole opened in a substantially center portion of an opposite surface of the main surface,
the first pin is inserted into the first positioning hole,
a large diameter portion and a small diameter portion are provided in an inner peripheral side of the first positioning hole,
a diameter of the small diameter portion is smaller than a diameter of the large diameter portion,
the large diameter portion is formed so as not to contact the first pin when the block is not inclined,
the block is configured to be inclined with the first pin as a fulcrum,
the block has a second positioning hole opened at a position away from a center portion of the opposite surface,
a second pin is fixed to the pressing member,
the second pin is inserted into the second positioning hole, and
the second positioning hole is an elongated hole in which a width in a first direction connecting the first pin and the second pin is longer than a width in a second direction orthogonal to the first direction.

12. The inspection jig according to claim 11, wherein the block includes:
a block main body having the main surface; and
a bush fixed to the substantially center portion of the opposite surface, the first positioning hole being formed in the bush.

13. The inspection jig according to claim 11, wherein:
the flexible substrate is fixed to a main substrate,
the contact portion protrudes from a contact through hole of the main substrate, and
the pressing member is fixed to the main substrate.

14. The inspection jig according to claim 12, wherein the large diameter portion is located on a side of the pressing member with respect to the small diameter portion.

15. The inspection jig according to claim 11, wherein the contact portion of the flexible substrate is located on an extension line of an axial direction of the first pin.

* * * * *